United States Patent
Zheng et al.

(10) Patent No.: US 12,184,278 B2
(45) Date of Patent: Dec. 31, 2024

(54) CIRCUIT, METHOD AND SYSTEM FOR AUTOMATIC LEVEL SWITCHING

(71) Applicant: NEWCOSEMI (BEIJING) TECHNOLOGY CO., LTD, Beijing (CN)

(72) Inventors: Hui Zheng, Beijing (CN); Deyi Pi, Beijing (CN); Bingqiang Zhu, Beijing (CN)

(73) Assignee: NEWCOSEMI (BEIJING) TECHNOLOGY CO., LTD, Beijing (CN)

( * ) Notice: Subject to any disclaimer, the term of this patent is extended or adjusted under 35 U.S.C. 154(b) by 0 days.

(21) Appl. No.: 18/189,630

(22) Filed: Mar. 24, 2023

(65) Prior Publication Data

US 2023/0344430 A1 Oct. 26, 2023

(30) Foreign Application Priority Data

Apr. 21, 2022 (CN) .......................... 202210420544.8

(51) Int. Cl.
*H03K 19/0185* (2006.01)

(52) U.S. Cl.
CPC .......................... *H03K 19/018507* (2013.01)

(58) Field of Classification Search
CPC ..... H03K 19/018521; H03K 19/00315; H03K 19/018507; H03K 19/09429; H03K 19/17772; H03K 19/003; H03K 19/007; H03K 5/08; G11C 5/14; G11C 11/417; G11C 2207/2227; G11C 5/147; G11C 5/148; G11C 29/12005; G11C 29/1201; G11C 29/48; G11C 29/56; G06F 1/3296; G06F 1/266; G06F 1/3206; G06F 1/3275; G06F 1/28; G06F 13/102; G06F 13/4068; Y02D 10/00

See application file for complete search history.

(56) References Cited

U.S. PATENT DOCUMENTS

| | | | | |
|---|---|---|---|---|
| 5,490,117 A | * | 2/1996 | Oda | G11C 5/143 365/228 |
| 5,995,440 A | * | 11/1999 | Lewis | G11C 5/14 365/185.23 |
| 7,239,198 B1 | * | 7/2007 | Drapkin | H03K 19/018528 327/563 |
| 11,108,230 B2 | * | 8/2021 | Long | H02J 7/0047 |
| 2014/0182354 A1 | | 7/2014 | Jiang | |
| 2017/0222650 A1 | | 8/2017 | Cui | |

FOREIGN PATENT DOCUMENTS

| | | |
|---|---|---|
| CN | 105577165 A | 5/2016 |
| CN | 206270953 U | 6/2017 |
| CN | 211062036 U | 7/2020 |

* cited by examiner

*Primary Examiner* — Lincoln D Donovan
*Assistant Examiner* — Tyler J Pereny
(74) *Attorney, Agent, or Firm* — Workman Nydegger

(57) ABSTRACT

A circuit, a method and a system for automatic level switching are provided. The circuit for automatic level switching comprises a level selector, a chip IO interface and a level detector; wherein, each input terminal of the level selector is connected to a different input voltage, and an output terminal of the level selector provides the chip IO interface with an interface level; the chip IO interface is connected to an off-chip device; a control terminal of the level detector is connected to a control terminal of the level selector, and a detection terminal of the level detector is connected to the chip IO interface.

15 Claims, 3 Drawing Sheets ns.8, titled "CIRCUIT, METHOD
CIRCUIT, METHOD AND SYSTEM FOR AUTOMATIC LEVEL SWITCHING This application claims priority to Chinese Patent Application No. 202210420544.8, titled "CIRCUIT, METHOD AND SYSTEM FOR AUTOMATIC LEVEL SWITCHING", filed on Apr. 21, 2022, with the China National Intellectual Property Administration, which is incorporated herein by reference in its entirety.

FIELD

The present disclosure relates to the technical field of electronic circuits, and in particular to a circuit, method and system for automatic level switching.

BACKGROUND

In chip applications, the chip often needs to communicate with external circuit(s) in order to receive commands from the external circuit and perform corresponding actions, and to feed back the execution results of the chip to the external circuit. In this case, the chip IO interface level is required to be consistent with the configured operating voltage of the external circuit. Therefore, the chip IO interface level needs to be switched according to the operating voltage configured for the external circuit.

In the conventional technology, the chip IO interface level is mainly switched by configuring the register. In different operation scenarios, different chip IO interface levels are used. The register has to be reconfigured manually whenever the operation scene is switched, which can be complicated. Therefore, it is urgent to solve the complicated problem caused by manually configuring the register to switch the chip IO interface level upon switching the scenario.

SUMMARY

In view of this, a circuit, a method and a system for automatic level switching are provided according to embodiments of the present disclosure, so as to achieve the purpose of automatically switching the chip IO interface level according to the operating voltage of an off-chip device.

To this end, the technical solutions according to embodiments of the present disclosure are provided as follows.

According to a first aspect of the embodiments of the present disclosure, a circuit for automatic level switching is disclosed, the circuit includes a level selector, a chip IO interface and a level detector;
  the level selector is configured with n input terminals each connected to different input voltages, and an output terminal of the level selector provides the chip IO interface with an interface level; the chip IO interface is connected to an off-chip device, n is a positive integer greater than or equal to 2; and
  a control terminal of the level detector is connected to a control terminal of the level selector, and a detection terminal of the level detector is connected to the chip IO interface, the level detector is configured to detect a voltage at the chip IO interface, obtain an operating voltage value of the off-chip device based on the detected voltage at the chip IO interface, and generate a corresponding control signal based on the operating voltage value, and control, via the control signal, the level selector to switch a corresponding input terminal to provide the chip IO interface with a corresponding interface level, so that the chip IO interface level is consistent with the operating voltage of the off-chip device.

In an embodiment, the level selector includes n switch transistors and a control logic circuit;
  input terminal of each switch transistor is connected to a different input voltage, output terminal of each switch transistor provides the chip IO interface with the interface level, and control terminal of each switch transistor is connected to an output terminal of the control logic circuit, and a control terminal of the control logic circuit is connected to the control terminal of the level detector; and
  upon the off-chip device is powered on, the control logic circuit is configured to control a switch transistor connected to the maximum input voltage to be turned on and other switch transistors to be turned off based on the control signal; in a case that the off-chip device is in an operating state after being powered on, the control signal includes the operating voltage value of the off-chip device, and the control logic circuit is configured to control a corresponding switch transistor to be turned on and other switch transistors to be turned off based on the control signal, wherein the input voltage value connected to the corresponding switch transistor is consistent with the operating voltage value.

In an embodiment, the level selector includes n PMOS transistors and a control logic circuit;
  source of each PMOS transistor is connected to a different input voltage, drain of each PMOS transistor is connected together to form a common terminal, and the common terminal is used as the output terminal of the level selector to provide the chip IO interface with the interface level, a control terminal of the control logic circuit is connected to the control terminal of the level detector, and an output terminal of the control logic circuit is connected to each gate of each PMOS transistor; and
  upon the off-chip device is powered on, the control logic circuit is configured to control a PMOS transistor connected to the maximum input voltage to be turned on and other PMOS transistors to be turned off based on the control signal; in a case that the off-chip device is in an operating state after being powered on, the control signal includes the operating voltage value of the off-chip device, and the control logic circuit is configured to control a corresponding PMOS transistor to be turned on and other PMOS transistors to be turned off based on the control signal, wherein the input voltage value connected to the corresponding PMOS transistor is consistent with the operating voltage value.

In an embodiment, the level detector includes a level detecting circuit and a register, and the register is configured to store a correspondence relationship between voltages of the chip IO interface and operating voltage values of the off-chip device; wherein,
  a detection terminal of the level detecting circuit is connected to the chip IO interface, an output terminal of the level detecting circuit is connected to an input terminal of the register, and a control terminal of the register is connected to the control terminal of the level selector; and
  the level detecting circuit is configured to detect the voltage at the chip IO interface, the register is configured to obtain the operating voltage value of the off-chip device according to the voltage and the correspondence relationship, and generate the control signal based on the operating voltage value.

According to a second aspect of the embodiments of the present disclosure, a method for automatic level switching is disclosed, which is applied to the circuit for automatic level switching according to any one of the first aspect, the method includes:

detecting, by a level detector, a voltage at a chip IO interface;

obtaining, by the level detector, an operating voltage value of an off-chip device based on the detected voltage at the chip IO interface;

generating, by the level detector, a corresponding control signal based on the operating voltage value;

sending, by the level detector, the control signal to a level selector; and switching, by the level selector, a corresponding input terminal to provide the chip IO interface with a corresponding interface level based on the control signal.

In an embodiment, the level selector includes n switch transistors and a control logic circuit, n is a positive integer greater than or equal to 2, and the switching by the level selector a corresponding input terminal to provide the chip IO interface with a corresponding interface level based on the control signal includes:

controlling, by the control logic circuit, a switch transistor connected to the maximum input voltage to be turned on and other switch transistors to be turned off based on the control signal, upon the off-chip device is powered on; and controlling, by the control logic circuit, a corresponding switch transistor to be turned on and other switch transistors to be turned off based on the control signal, in a case that the off-chip device is in an operating state after being powered on, wherein the control signal includes the operating voltage value of the off-chip device.

In an embodiment, wherein the level selector includes n PMOS transistors and a control logic circuit, the value of n is a positive integer greater than or equal to 2, and the switching by the level selector a corresponding input terminal to provide the chip IO interface with a corresponding interface level based on the control signal includes:

controlling, by the control logic circuit, a PMOS transistor connected to the maximum input voltage to be turned on and other PMOS transistors to be turned off based on the control signal, upon the off-chip device is powered on; and controlling, by the control logic circuit, a corresponding PMOS transistor to be turned on and other PMOS transistors to be turned off based on the control signal, in a case that the off-chip device is in an operating state after being powered on, wherein the control signal includes the operating voltage value of the off-chip device.

In an embodiment, the level detector includes a level detecting circuit and a register, and the register is configured to store a correspondence relationship between voltages of the chip IO interface and operating voltage values of the off-chip device; the obtaining by the level detector an operating voltage value of the off-chip device based on the detected voltage at the chip IO interface includes:

detecting, by the level detecting circuit, the voltage at the chip IO interface; and obtaining, by the register, the operating voltage value of the off-chip device according to the voltage and the correspondence relationship.

According to a third aspect of the embodiments of the present disclosure, a system for automatic level switching is disclosed, the system includes any one embodiment of the above circuit for automatic level switching; and an off-chip device, connected to the chip IO interface in the circuit for automatic level switching, the circuit for automatic level switching is configured to identify the operating voltage of the off-chip device, and enable the chip IO interface level to be consistent with the operating voltage of the off-chip device through level switching.

In an embodiment, the off-chip device is an off-chip communication device.

According to the embodiments of the present disclosure, a circuit, a method and a system for automatic level switching are provided, the circuit for automatic level switching includes: a level selector, a chip IO interface and a level detector; where the level selector is configured with n input terminals each connected to different input voltages, and an output terminal of the level selector provides the chip IO interface with an interface level; the chip IO interface is connected to an off-chip device, n is a positive integer greater than or equal to 2; a control terminal of the level detector is connected to a control terminal of the level selector, and a detection terminal of the level detector is connected to the chip IO interface, and the level detector is configured to detect a voltage at the chip IO interface, obtain an operating voltage value of the off-chip device based on the detected voltage at the chip IO interface, and generate a corresponding control signal based on the operating voltage value, and control the level selector to switch a corresponding input terminal to provide the chip IO interface with a corresponding interface level via the control signal, so that the chip IO interface level is consistent with the operating voltage of the off-chip device. In this solution, the voltage at the chip IO interface is detected by the level detector; the operating voltage value of the off-chip device is obtained according to the voltage; the corresponding control signal is generated based on the operating voltage value; and the level selector is controlled to switch the chip IO interface via the control signal. In this way, the chip IO interface level is consistent with the operating voltage of the off-chip device, thereby realizing the purpose of automatically switching the chip IO interface level according to the operating voltage of the off-chip device.

BRIEF DESCRIPTION OF THE DRAWINGS

In order to more clearly explain the technical solutions in the embodiments of the present disclosure or in the conventional technology, the drawings used in the description of the embodiments or the conventional technology are briefly introduced hereinafter. It is apparent that the drawings in the following description illustrate only embodiments of the present disclosure. Other drawings may be obtained by those skilled in the art without creative efforts based on the provided drawings.

DETAILED DESCRIPTION OF EMBODIMENTS

The technical solutions in the embodiments of the present disclosure will be described clearly and completely hereinafter in combination with the drawings in the embodiments of the disclosure. It is apparent that the described embodiments are only part of the embodiments of the present disclosure, rather than all of the embodiments. Based on the embodiments of the present disclosure, all other embodiments obtained by those skilled in the art without creative efforts fall within the protection scope of the present disclosure.

In the present disclosure, terms "comprising", "including", or any other variant thereof are intended to encompass a non-exclusive inclusion such that processes, methods, articles, or devices that include a series of elements include not only those elements but also those that are not explicitly listed or other elements that are inherent to such processes, methods, articles, or devices. Unless expressively limited otherwise, a process, method, article or device limited by "comprising/including a(n) . . . " does not exclude existence of another identical element in the process, method, article or device.

It can be seen from the background technology that the chip IO interface level is mainly switched by manually configuring the register. The register has to be reconfigured manually whenever the operating scene is switched, which is complicated.

Therefore, a circuit, method and system for automatic level switching are disclosed, according to embodiments of the present disclosure. In this solution, the voltage at chip IO interface is detected by the level detector; the operating voltage value of the off-chip device is obtained according to the voltage; the corresponding control signal is generated based on the operating voltage value; and the level selector is controlled via the control signal to switch the chip IO interface. In this way, the chip IO interface level is consistent with the operating voltage of the off-chip device, thereby realizing the purpose of automatically switching the chip IO interface level according to the operating voltage of the off-chip device, which will be described in detail through the embodiments hereinafter.

Figure 1:
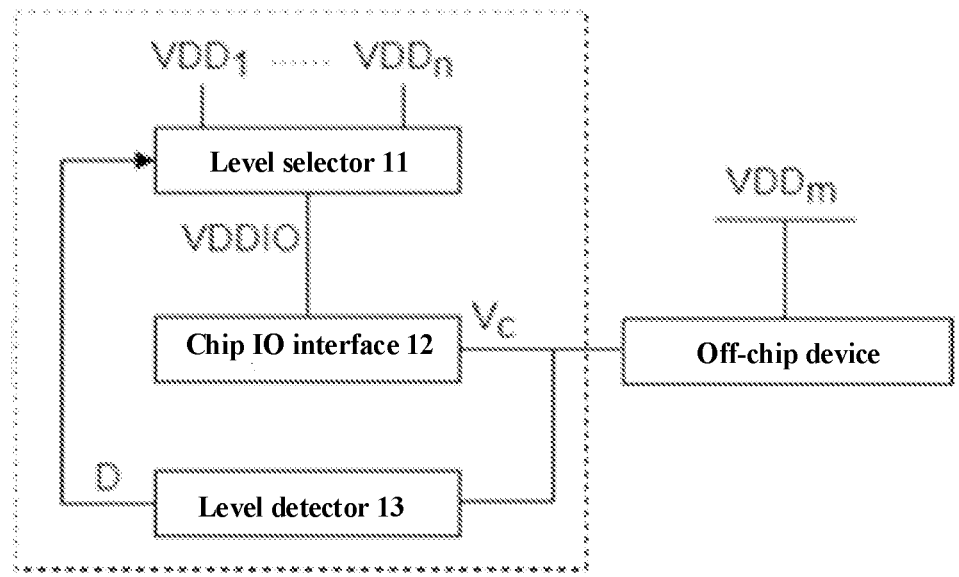
FIG. 1 is a structural diagram of a circuit for automatic level switching according to an embodiment of the present disclosure.

FIG. 1 is a structural diagram of a circuit for automatic level switching according to an embodiment of the present disclosure. The circuit includes a level selector 11, a chip IO interface 12 and a level detector 13.

In an embodiment, the level selector 11 has n input terminals, where n is a positive integer greater than or equal to 2, and each input terminal is connected to a different input voltage, that is, the input voltage $VDD_1$ to the input voltage $VDD_n$.

The output terminal of the level selector 11 provides the chip IO interface 12 with an interface level, and the chip IO interface 12 is connected to an off-chip device, where the value of n is a positive integer greater than 2 or equal to 2.

The control terminal of the level detector 13 is connected to the control terminal of the level selector 11, and the detection terminal of the level detector 13 is connected to the chip IO interface 12.

The level detector 13 may detect the voltage $V_c$ at the chip IO interface 12; obtain the operating voltage value $VDD_m$ of the off-chip device based on the detected voltage $V_c$ at the chip IO interface 12; generate a corresponding control signal based on the operating voltage value $VDD_m$; and control the level selector 11 via the control signal to switch a corresponding input terminal to provide the corresponding interface level VDDIO to the chip IO interface 12, to allow that the interface level VDDIO of the chip IO interface 12 is consistent with the operating voltage value $VDD_m$ of the off-chip device.

In a specific implementation, the available range of the operating voltage $VDD_m$ of the off-chip device is from the input voltage $VDD_1$ to the input voltage $VDD_n$. Upon the off-chip device is powered on, the level detector 13 generates and sends a control signal to the level selector 11. Based on the control signal, the level selector 11 selects the input terminal, which is connected to the maximum input voltage, to connect the chip IO interface 12 with interface level VDDIO.

When the off-chip device is powered on, in order to prevent backward flowing of the voltage caused by the case of the operating voltage connected to the off-chip device being greater than the interface level of the chip IO interface 12, the level selector 11 selects the input terminal connected to the maximum input voltage to provide the chip IO interface 12 with the interface level. In this way, the backward flowing of the voltage will not be caused.

In a case that the off-chip device is in an operating state after being powered on, the level detector 13 generates the control signal including the operating voltage value $VDD_m$ of the off-chip device. And based on the control signal, the level selector 11 selects, among the n input terminals, the input terminal that has the input voltage consistent with the operating voltage value, to connect the chip IO interface 12 with the interface level VDDIO.

In a case that the off-chip device is in an operating state after being powered on, the operating voltage value $VDD_m$ is a stable value. The specific implementation of how the level detector 13 obtains the operating voltage value $VDD_m$ of the off-chip device according to the voltage $V_c$ at the chip IO interface 12 may refer to the following embodiments.

For example, the level selector 11 has three input terminals, and each input terminal is connected to a different input voltage, that is, the input voltage $VDD_1$ to the input voltage $VDD_3$ of 1.8V, 2.5V and 3.3V respectively.

Upon the off-chip device is powered on, the maximum input voltage (i.e., 3.3V) is selected based on the control signal and is connected to the chip IO interface 12 to prevent the backward flowing of the voltage.

In a case that the off-chip device is in the operating state after being powered on, the level detector 13 obtains the operating voltage value $VDD_m$ of the off-chip device of 2.5V, and then generates a control signal based on the operating voltage value $VDD_m$ of the off-chip device so that the control signal carries with the information that the operating voltage value $VDD_m$ of the off-chip device is 2.5V. Based on the control signal, the level selector 11 selects the input terminal $VDD_2$, of which the input voltage is consistent with the operating voltage value, among three input terminals, then connects to the chip IO interface 12 with the interface level VDDIO of 2.5V.

It should be noted that the level detector 13 detects the voltage $V_c$ of the chip IO interface in real time to obtain the operating voltage value $VDD_m$ of the off-chip device. Whenever the operating voltage value $VDD_m$ of the off-chip device changes, the level selector 11 switches the interface level VDDIO of the chip IO interface 12 according to the control signal in real time.

Figure 5:
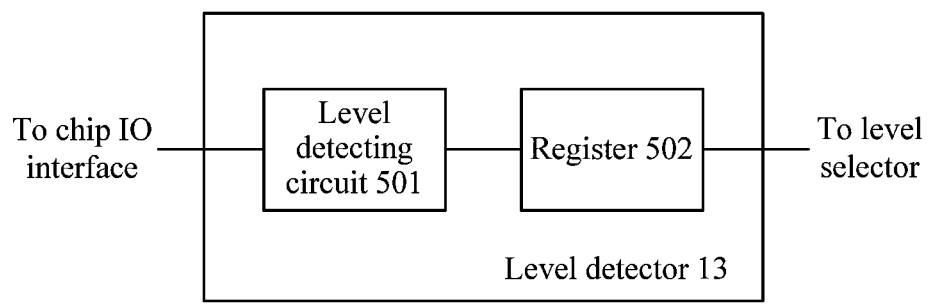
FIG. 5 is a structural diagram of a level detector according to an embodiment of the present disclosure.

In one embodiment, the level detector 13 includes a level detecting circuit 501 and a register 502, as shown in FIG. 5.

In an embodiment, the detection terminal of the level detecting circuit is connected to the chip IO interface 12, the output terminal of the level detecting circuit is connected to the input terminal of the register. And the control terminal of the register is connected to the control terminal of the level selector 11.

In a specific implementation, the register stores a correspondence relationship between voltages $V_c$ at the chip IO interface 12 detected by the level detecting circuit and operating voltage values $VDD_m$ of the off-chip device. Based on the correspondence relationship and the voltage $V_c$ at the chip IO interface 12, the operating voltage value $VDD_m$ of the off-chip device may be obtained. Finally, the register generates the control signal based on the operating voltage value $VDD_m$ of the off-chip device.

For example, the level detecting circuit detects that the voltage $V_c$ at the chip IO interface 12 is 2.8V. Then, the operating voltage value $VDD_m$ of the off-chip device may be determined as 3.3V through the correspondence relationship stored in the register. A control signal with the information that the operating voltage value $VDD_m$ is 3.3V may be generated based on the operating voltage of the off-chip device value $VDD_m$.

Based on the above circuit for automatic level switching disclosed in the embodiment of the present disclosure, the voltage at the chip IO interface is detected by the level detector; the operating voltage value of the off-chip device is obtained according to the voltage; the corresponding control signal is generated based on the operating voltage value; and the level selector is controlled via the control signal to switch the chip IO interface. In this way, the chip IO interface level is greater than or equal to the operating voltage of the off-chip device when the off-chip device is powered on, thereby eliminating the backward flowing of the voltage. In addition, the chip IO interface level is consistent with the operating voltage of the off-chip device in a case that the off-chip device is in the operating state after being powered on, thereby realizing the purpose of automatically switching the chip IO interface level according to the operating voltage of the off-chip device.

Figure 2:
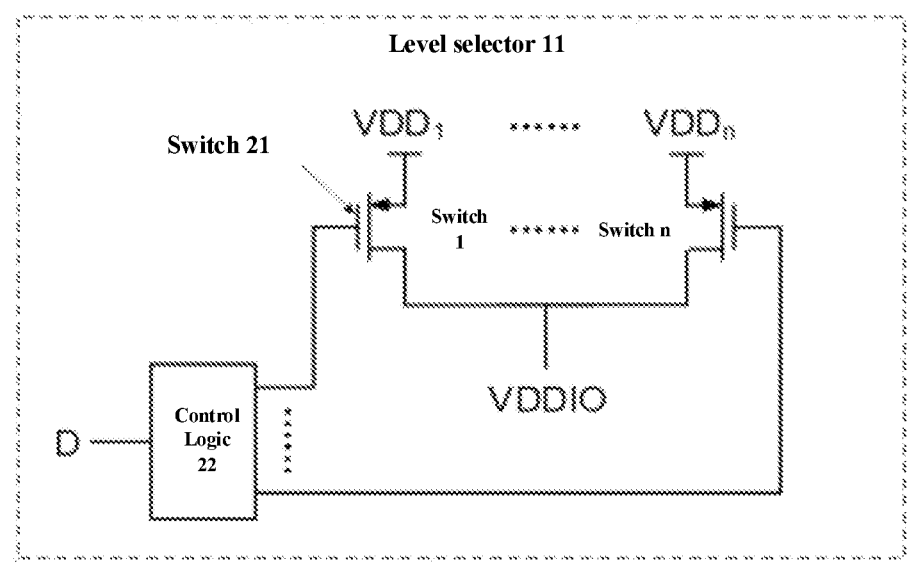
FIG. 2 is a structural diagram of a level selector according to an embodiment of the present disclosure.

In conjunction with FIG. 1, FIG. 2 is a structural diagram of a level selector according to an embodiment of the present disclosure. As shown in FIG. 2, the level selector 11 further includes n switch transistors 21 (switch transistor 1 to n) and a control logic circuit 22.

In an embodiment, input terminals of switch transistors are respectively connected to different input voltages $VDD_1$ to $VDD_n$.

Output terminals of switch transistors 21 provide the chip IO interface 12 with interface levels, and control terminals of the switch transistors 21 are connected to the output terminal of the control logic circuit 22.

The control terminal of the control logic circuit 22 is connected to the control terminal of the level detector 13.

It should be noted that the output terminals of the respective switch transistors 21 are connected together to form a common terminal, and the common terminal is used as the output terminal of the level selector.

The specific process for the level detector 13 to detect the voltage $V_c$ at the chip IO interface 12, obtain the operating voltage value $VDD_m$ of the off-chip device based on the detected voltage $V_c$ at the chip IO interface 12 and generate a corresponding control signal based on the operating voltage value $VDD_m$ may be referred to the above embodiments.

Upon the off-chip device is powered on, the control logic circuit 22 controls, based on the control signal, the switch transistor 21 connected to the maximum input voltage to be turned on and other switch transistors 21 to be turned off. In this case, the chip IO interface 12 is connected to the maximum input voltage as the interface level VDDIO via the turned-on switch transistor 21.

In a case that the off-chip device is in the operating state after being powered on, the control signal includes the operating voltage value $VDD_m$ of the off-chip device, and the control logic circuit 22 controls, based on the control signal, a corresponding switch transistor 21 to be turned on and other switch transistors 21 to be turned off, where the interface level VDDIO connected to the chip IO interface via the corresponding switch transistor 21 is consistent with the operating voltage $VDD_m$.

For example, the level selector 11 may further include three switch transistors 21 (switch transistors 1 to 3) and a control logic circuit 22. The input terminals of switch transistor 1 to switch transistor 3 are respectively connected to input voltages of 1.8V, 2.5V and 3.3V.

Upon the off-chip device is powered on, the switch transistor 21 connected to the 3.3V voltage is controlled to be turned on, and other switch transistors 21 are turned off, based on the control signal, so that the chip IO interface 12 is connected to the 3.3V interface level to prevent the backward flowing of the voltage.

In a case that the off-chip device is in the operating state after being powered on, the operating voltage value $VDD_m$ of the off-chip device obtained by the level detector 13 is 1.8V. And, a control signal is generated based on the operating voltage value $VDD_m$ of the off-chip device so that the control signal carries with the information that the operating voltage value $VDD_m$ of the off-chip device is 1.8V. Then, the level selector 11 controls, based on the control signal, the switch transistor 21 connected to the 1.8V voltage to be turned on and other switch transistors 21 to be turned off so as to connect the chip IO interface 12 to the 1.8V interface level VDDIO.

Based on the above circuit for automatic level switching disclosed in the embodiment of the present disclosure, the voltage at the chip IO interface is detected by the level detector; the operating voltage value of the off-chip device is obtained according to the voltage; the corresponding control signal is generated based on the operating voltage value; and the chip IO interface level is switched by controlling the switch transistors to be turned on or off via the control signal. In this way, the chip IO interface level is greater than or equal to the operating voltage of the off-chip device when the off-chip device is powered on, thereby eliminating the backward flowing of the voltage. In addition, the chip IO interface level is consistent with the operating voltage of the off-chip device in a case that the off-chip device is in the operating state after being powered on, thereby realizing the purpose of automatically switching the chip IO interface level according to the operating voltage of the off-chip device.

Figure 3:
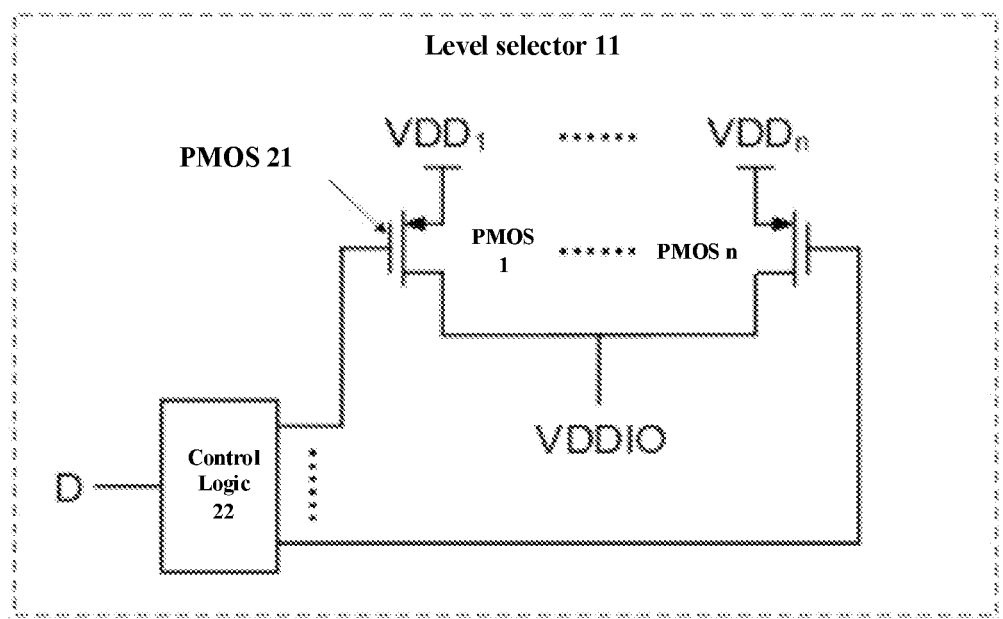
FIG. 3 is a structural diagram of a level selector according to another embodiment of the present disclosure.

In conjunction with FIG. 1, FIG. 3 is a structural diagram of a level selector according to another embodiment of the present disclosure. As shown in FIG. 3, the level selector 11 includes n PMOS transistors 31 (PMOS transistor 1 to PMOS transistor n) and a control logic circuit 32.

In an embodiment, sources of PMOS transistors 31 are respectively connected to different input voltages $VDD_1$ to $VDD_m$.

Drains of the PMOS transistors 31 are connected together to form a common terminal, and the common terminal is used as the output terminal of the level selector 11 to provide the chip IO interface 12 with the interface level.

The control terminal of the control logic circuit 32 is connected to the control terminal of the level detector 13, the output terminal of the control logic circuit 32 is connected to the gates of the respective PMOS transistors 31, and the control terminal of the control logic circuit 32 is connected to the control terminal of the level detector 13.

The specific process for the level detector 13 to detect the voltage $V_c$ at the chip IO interface 12, obtain the operating voltage value $VDD_m$ of the off-chip device based on the detected voltage $V_c$ at the chip IO interface 12 and generate a corresponding control signal based on the operating voltage value $VDD_m$ may be referred to the above embodiments.

Upon the off-chip device is powered on, the control logic circuit 32 controls, based on the control signal, the PMOS transistor 31 connected to the maximum input voltage to be turned on and other PMOS transistors 31 to be turned off. In this case, the chip IO interface 12 is connected to the maximum input voltage as the interface level VDDIO via the conducted PMOS transistor 31 to prevent the backward flowing of the voltage.

In a case that the off-chip device is in the operating state after being powered on, the control signal includes the operating voltage value $VDD_m$ of the off-chip device, and the control logic circuit 32 controls, based on the control signal, the corresponding PMOS transistor 31 to be turned on and other PMOS transistors 31 to be turned off, where the interface level VDDIO connected to the chip IO interface via the corresponding PMOS transistor 31 is consistent with the operating voltage VDDm.

For example, the level selector 11 further includes three PMOS transistors 31 (PMOS transistors 1 to 3) and a control logic circuit 32. The input terminals of PMOS transistors 1 to 3 are respectively connected to input voltages of 1.8V, 2.5V and 3.3V.

Upon the off-chip device is powered on, based on the control signal, the PMOS transistor 31 connected to the 3.3V voltage is controlled to be turned on, and other PMOS transistors 31 are turned off, so that the chip IO interface 12 is connected to the 3.3V interface level to prevent the backward flowing of the voltage.

In a case that the off-chip device is in the operating state after being powered on, the operating voltage value VDDm of the off-chip device obtained by the level detector 13 is 1.8V. And, a control signal is generated based on the operating voltage value VDDm of the off-chip device so that the control signal carries with the information that the operating voltage value VDDm of the off-chip device is 1.8V. Then, based on the control signal, the level selector 11 controls the PMOS transistor 31 connected to the 1.8V voltage to be turned on and other PMOS transistors 31 to be turned off so as to connect the chip IO interface 12 to the 1.8V interface level VDDIO.

Based on the above circuit for automatic level switching disclosed in the embodiment of the present disclosure, the voltage at the chip IO interface is detected by the level detector; the operating voltage value of the off-chip device is obtained according to the voltage; the corresponding control signal is generated based on the operating voltage value; and the chip IO interface level is switched by controlling the PMOS transistors to be turned on or off via the control signal. In this way, the chip IO interface level is greater than or equal to the operating voltage of the off-chip device when the off-chip device is powered on, thereby eliminating the backward flowing of the voltage. In addition, the chip IO interface level is consistent with the operating voltage of the off-chip device in a case that the off-chip device is in the operating state after being powered on, thereby realizing the purpose of automatically switching the chip IO interface level according to the operating voltage of the off-chip device.

Figure 4:
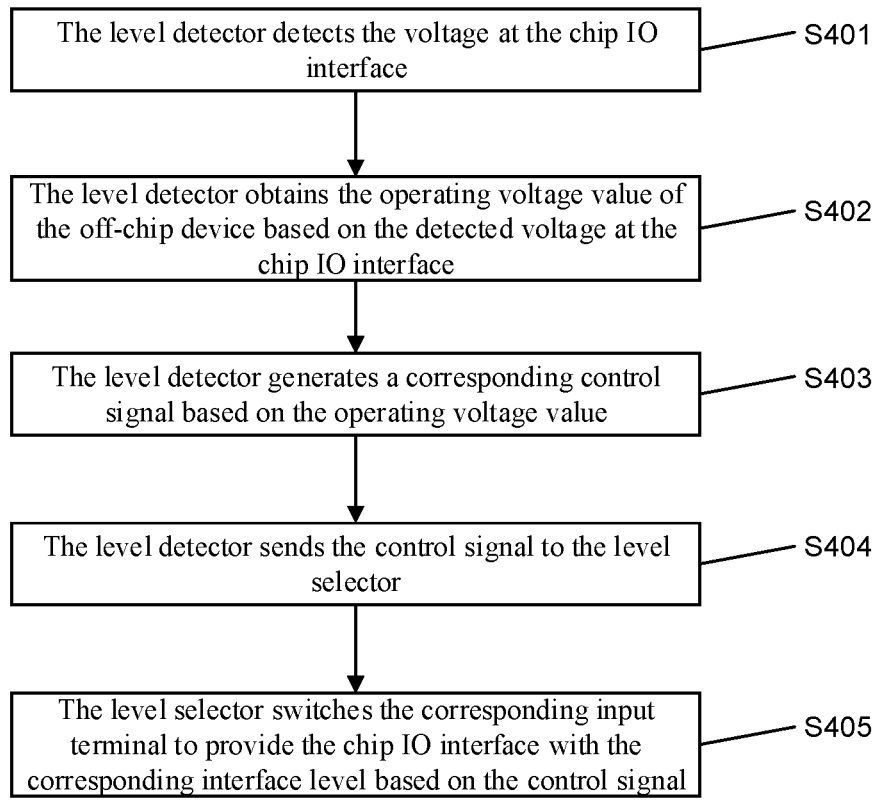
FIG. 4 is a flow chart of a method for automatic level switching according to an embodiment of the present disclosure.

Corresponding to the foregoing circuit for automatic level switching disclosed according to the embodiments of the present disclosure, FIG. 4 is a flow chart of a method for automatic level switching according to an embodiment of the present disclosure. As shown in FIG. 4, the method mainly includes the steps as follows.

In S401, the level detector detects the voltage at the chip IO interface.

In S402, the level detector obtains the operating voltage value of the off-chip device based on the detected voltage at the chip IO interface.

In the S402, the level detector includes a level detecting circuit and a register, and the register stores a correspondence relationship between voltages of the chip IO interface and operating voltage values of the off-chip device. And, the operating voltage value of the off-chip device may be obtained based on the correspondence relationship and the voltage at the chip IO interface.

In S403, the level detector generates a corresponding control signal based on the operating voltage value.

In the S403, in a case that the off-chip device is in the operating state after being powered on, the generated control signal includes the operating voltage value.

In S404, the level detector sends the control signal to the level selector.

In S405, the level selector switches the corresponding input terminal to provide the chip IO interface with a corresponding interface level based on the control signal.

In one embodiment, the level selector includes n switch transistors and a control logic circuit. Upon the off-chip device is powered on, the control logic circuit controls, based on the control signal, the switch transistor connected to the maximum input voltage to be turned on and other switch transistors to be turned off. In this case, the maximum interface level is connected to the chip IO interface through the conducted switch transistor. In a case that the off-chip device is in the operating state after being powered on, the control signal includes the operating voltage value of the off-chip device, and the control logic circuit controls the corresponding switch transistor to be turned on and other switch transistors to be turned off based on the control signal, where the interface level connected to the chip IO interface via the corresponding switch transistor is consistent with the operating voltage value.

In one embodiment, the level selector includes n PMOS transistors and a control logic circuit. Upon the off-chip device is powered on, the control logic circuit controls, based on the control signal, the PMOS transistor connected to the maximum input voltage to be turned on and other PMOS transistors to be turned off. In this case, the maximum interface level is connected to the chip IO interface through the conducted PMOS transistor. In a case that the off-chip device is in the operating state after being powered on, the control signal includes the operating voltage value of the off-chip device, and the control logic circuit controls, based on the control signal, the corresponding PMOS transistor to be turned on and other PMOS transistors to be turned off, where the interface level connected to the chip IO interface via the corresponding PMOS transistor is consistent with the operating voltage value.

Based on the above method for automatic level switching disclosed in the embodiment of the present disclosure, the voltage at the chip IO interface is detected by the level detector; the operating voltage value of the off-chip device is obtained according to the voltage; the corresponding control signal is generated based on the operating voltage value; and the chip IO interface level is switched by controlling the switch transistors or the PMOS transistors to be turned on or off via the control signal. In this way, the chip IO interface level is greater than or equal to the operating voltage of the off-chip device when the off-chip device is powered on, thereby eliminating the backward flowing of the voltage. In addition, the chip IO interface level is consistent with the operating voltage of the off-chip device in a case that the off-chip device is in the operating state after being powered on, thereby realizing the purpose of automatically switching the chip IO interface level according to the operating voltage of the off-chip device.

Corresponding to the circuit and method for automatic level switching disclosed in the above embodiments of the present disclosure, a system for automatic level switching is also disclosed according to the embodiment of the present disclosure. The system may include any one of the foregoing circuits for automatic level switching disclosed in the above-mentioned embodiments and an off-chip device connected to the circuit for automatic level switching.

In an embodiment, the off-chip device is connected to the chip IO interface in the circuit for automatic level switching, where the circuit for automatic level switching has n input terminals, which are respectively connected to n different input voltages.

In a specific implementation, upon the off-chip device is powered on, the circuit for automatic level switching automatically connects the maximum input voltage among the n input voltages to the chip IO interface as the interface level, to prevent backward flowing of the voltage.

In a case that the off-chip device is in the operating state after being powered on, the circuit for automatic level switching automatically switches the chip IO interface level according to the operating voltage value of the off-chip device, so that the chip IO interface level is consistent with the operating voltage of the off-chip device.

In one embodiment, the off-chip device is an off-chip communication device.

Based on the above system for automatic level switching disclosed in the embodiment of the present disclosure, the operating voltage value of the off-chip device is obtained according to the voltage at the chip IO interface, and then the chip IO interface level is switched based on the operating voltage value. In this way, the chip IO interface level is greater than or equal to the operating voltage of the off-chip device when the off-chip device is powered on, thereby eliminating the backward flowing of the voltage. In addition, the chip IO interface level is consistent with the operating voltage of the off-chip device in a case that the off-chip device is in the operating state after being powered on, thereby realizing the purpose of automatically switching the chip IO interface level according to the operating voltage of the off-chip device.

Each embodiment in this specification is described in a progressive manner, the same and similar parts of the various embodiments in this specification can be referred to each other, and each embodiment focuses on the differences from other embodiments. In particular, for the system or the system embodiment, since it is basically similar to the method embodiment, the description is relatively simple. The related parts can be referred to the part of the description of the method embodiment. The systems and system embodiments described above are merely illustrative, wherein the units described as separate components may or may not be physically separated, and the components shown as units may or may not be physical units, that is, they can be located in one place, or they can be distributed to multiple network elements. Part or all of the modules may be selected according to actual requirements to achieve the purpose of the solution of this embodiment. It can be understood and implemented by those skilled in the art without creative efforts.

Those skilled in the art can further realize that the units and algorithm steps of the examples described in conjunction with the embodiments disclosed herein can be implemented by electronic hardware, computer software or a combination of the two. In order to clearly illustrate the possible interchangeability of the hardware and software, the components and steps of each example have been generally described according to their functions in the above description. Whether these functions are executed by hardware or software may depend on the specific applications and design constraints of the technical solution. Those skilled in the art may use different methods to implement the described functions for each specific application, but such implementation should not be regarded as beyond the scope of the present disclosure.

According to the above description of the disclosed embodiments, those skilled in the art can implement or practice the present disclosure. Many modifications to these embodiments are apparent to those skilled in the art. The general principles defined herein may be applied to other embodiments without departing from the spirit or scope of the present disclosure. Therefore, the present disclosure should not be limited to the embodiments disclosed herein, rather, has the widest scope in accordance with the principle and the novel features disclosed herein.

What is claimed is:

1. A circuit for automatic level switching, comprising: a level selector, a chip IO interface and a level detector, wherein:
    the level selector is configured with n input terminals each connected to different input voltages, and an output terminal of the level selector provides the chip IO interface with an interface level; the chip IO interface is connected to an off-chip device, wherein n is a positive integer greater than or equal to 2;
    a control terminal of the level detector is connected to a control terminal of the level selector, and a detection terminal of the level detector is connected to the chip IO interface, the level detector is configured to detect a voltage at the chip IO interface, obtain an operating voltage value of the off-chip device based on the detected voltage at the chip IO interface, generate a control signal based on the operating voltage value, and control, via the control signal, the level selector to switch a corresponding input terminal to provide the chip IO interface with a chip IO interface level consistent with the operating voltage of the off-chip device; and
    upon the off-chip device is powered on, the level selector is configured to select one of the n input terminals which is connected to a maximum input voltage to provide the chip IO interface with the interface level equal to the maximum input voltage.

2. The circuit according to claim 1, wherein the level selector comprises n switch transistors and a control logic circuit;
    input terminals of the switch transistors are connected to different input voltages, output terminals of the switch transistor provide the chip IO interface with interface levels, and control terminals of the switch transistors are connected to an output terminal of the control logic circuit, and a control terminal of the control logic circuit is connected to the control terminal of the level detector; and upon the off-chip device is powered on, the control logic circuit is configured to control, based on the control signal, a switch transistor connected to the maximum input voltage to be turned on and other switch transistors to be turned off; in a case that the off-chip device is in an operating state after being powered on, the control signal includes the operating voltage value of the off-chip device, and the control logic circuit is configured to control, based on the control signal, a corresponding switch transistor to be turned on and other switch transistors to be turned off, wherein the input voltage value connected to the corresponding switch transistor is consistent with the operating voltage value.

3. The circuit according to claim 1, wherein the level selector comprises n PMOS transistors and a control logic circuit;

sources of the PMOS transistors are connected to different input voltages, drains of the PMOS transistors are connected together to form a common terminal, and the common terminal is used as the output terminal of the level selector to provide the chip IO interface with the interface level, a control terminal of the control logic circuit is connected to the control terminal of the level detector, and an output terminal of the control logic circuit is connected to gates of the PMOS transistors; and upon the off-chip device is powered on, the control logic circuit is configured to control, based on the control signal, a PMOS transistor connected to the maximum input voltage to be turned on and other PMOS transistors to be turned off; in a case that the off-chip device is in an operating state after being powered on, the control signal includes the operating voltage value of the off-chip device, and the control logic circuit is configured to control, based on the control signal, a corresponding PMOS transistor to be turned on and other PMOS transistors to be turned off, wherein the input voltage value connected to the corresponding PMOS transistor is consistent with the operating voltage value.

4. The circuit according to claim 1, wherein the level detector includes a level detecting circuit and a register, and the register is configured to store a correspondence relationship between voltages of the chip IO interface and operating voltage values of the off-chip device; wherein, a detection terminal of the level detecting circuit is connected to the chip IO interface, an output terminal of the level detecting circuit is connected to an input terminal of the register, and a control terminal of the register is connected to the control terminal of the level selector; and the level detecting circuit is configured to detect the voltage at the chip IO interface, the register is configured to obtain the operating voltage value of the off-chip device according to the voltage and the correspondence relationship, and generate the control signal based on the operating voltage value.

5. The circuit according to claim 2, wherein the level detector includes a level detecting circuit and a register, and the register is configured to store a correspondence relationship between voltages of the chip IO interface and operating voltage values of the off-chip device; wherein, a detection terminal of the level detecting circuit is connected to the chip IO interface, an output terminal of the level detecting circuit is connected to an input terminal of the register, and a control terminal of the register is connected to the control terminal of the level selector; and the level detecting circuit is configured to detect the voltage at the chip IO interface, the register is configured to obtain the operating voltage value of the off-chip device according to the voltage and the correspondence relationship, and generate the control signal based on the operating voltage value.

6. The circuit according to claim 3, wherein the level detector includes a level detecting circuit and a register, and the register is configured to store a correspondence relationship between voltages of the chip IO interface and operating voltage values of the off-chip device; wherein, a detection terminal of the level detecting circuit is connected to the chip IO interface, an output terminal of the level detecting circuit is connected to an input terminal of the register, and a control terminal of the register is connected to the control terminal of the level selector; and the level detecting circuit is configured to detect the voltage at the chip IO interface, the register is configured to obtain the operating voltage value of the off-chip device according to the voltage and the correspondence relationship, and generate the control signal based on the operating voltage value.

7. A method for automatic level switching, applied to a circuit for automatic level switching, wherein the circuit for automatic level switching, comprising: a level selector, a chip IO interface and a level detector, the level selector is configured with n input terminals each connected to different input voltages, and an output terminal of the level selector provides the chip IO interface with an interface level; the chip IO interface is connected to an off-chip device, wherein n is a positive integer greater than or equal to 2; and a control terminal of the level detector is connected to a control terminal of the level selector, and a detection terminal of the level detector is connected to the chip IO interface, the level detector is configured to detect a voltage at the chip IO interface, obtain an operating voltage value of the off-chip device based on the detected voltage at the chip IO interface, generate a control signal based on the operating voltage value, and control, via the control signal, the level selector to switch a corresponding input terminal to provide the chip IO interface with a chip IO interface level consistent with the operating voltage of the off-chip device;

wherein the method comprises:

upon the off-chip device is powered on:
controlling the level selector to select one of the n input terminals which is connected to a maximum input voltage, to provide the chip IO interface with the interface level equal to the maximum input voltage;

in response to the off-chip device being in an operating state after being powered on:
detecting, by the level detector, the voltage at the chip IO interface;
obtaining, by the level detector, the operating voltage value of an off-chip device based on the detected voltage at the chip IO interface;
generating, by the level detector, the control signal based on the operating voltage value;

sending, by the level detector, the control signal to the level selector; and switching, by the level selector, the input terminal to provide the chip IO interface with the chip IO interface level consistent with the operating voltage of the off-chip device, based on the control signal.

8. The method according to claim 7, wherein the level selector comprises n switch transistors and a control logic circuit, n is a positive integer greater than or equal to 2, and the switching by the level selector an input terminal to provide the chip IO interface with an interface level based on the control signal comprises:

upon the off-chip device is powered on, controlling, by the control logic circuit, a switch transistor connected to the maximum input voltage to be turned on and other switch transistors to be turned off based on the control signal; and in a case that the off-chip device is in the operating state after being powered on, controlling, by the control logic circuit, a corresponding switch transistor to be turned on and other switch transistors to be turned off based on the control signal, wherein the control signal includes the operating voltage value of the off-chip device.

9. The method according to claim 7, wherein the level selector comprises n PMOS transistors and a control logic circuit, n is a positive integer greater than or equal to 2, and the switching by the level selector an input terminal to provide the chip IO interface with an interface level based on the control signal comprises:

upon the off-chip device is powered on, controlling, by the control logic circuit, a PMOS transistor connected to the maximum input voltage to be turned on and other PMOS transistors to be turned off based on the control signal; and in a case that the off-chip device is in the operating state after being powered on, controlling, by the control logic circuit, a corresponding PMOS transistor to be turned on and other PMOS transistors to be turned off based on the control signal, wherein the control signal includes the operating voltage value of the off-chip device.

10. The method according claim 7, wherein the level detector includes a level detecting circuit and a register, and the register is configured to store a correspondence relationship between voltages of the chip IO interface and operating voltage values of the off-chip device; the obtaining by the level detector an operating voltage value of the off-chip device based on the detected voltage at the chip IO interface comprises:

detecting, by the level detecting circuit, the voltage at the chip IO interface; and obtaining, by the register, the operating voltage value of the off-chip device according to the voltage and the correspondence relationship.

11. A system for automatic level switching, comprising:

a circuit for automatic level switching, wherein the circuit for automatic level switching comprising: a level selector, a chip IO interface and a level detector, wherein:

the level selector is configured with n input terminals each connected to different input voltages, and an output terminal of the level selector provides the chip IO interface with an interface level; the chip IO interface is connected to an off-chip device, wherein n is a positive integer greater than or equal to 2;

a control terminal of the level detector is connected to a control terminal of the level selector, and a detection terminal of the level detector is connected to the chip IO interface, the level detector is configured to detect a voltage at the chip IO interface, obtain an operating voltage value of the off-chip device based on the detected voltage at the chip IO interface, generate a control signal based on the operating voltage value, and control, via the control signal, the level selector to switch a corresponding input terminal to provide the chip IO interface with a chip IO interface level consistent with the operating voltage of the off-chip device; and upon the off-chip device is powered on, the level selector is configured to select one of the n input terminals which is connected to a maximum input voltage to provide the chip IO interface with an interface level equal to the maximum input voltage; and the off-chip device, connected to the chip IO interface in the circuit for automatic level switching, the circuit for automatic level switching is configured to identify the operating voltage of the off-chip device, and enable the chip IO interface level to be consistent with the operating voltage of the off-chip device through level switching.

12. The system according to claim 11, wherein the off-chip device is an off-chip communication device.

13. The system according to claim 11, wherein the level selector comprises n switch transistors and a control logic circuit;

input terminals of the switch transistors are connected to different input voltages, output terminals of the switch transistor provide the chip IO interface with interface levels, and control terminals of the switch transistors are connected to an output terminal of the control logic circuit, and a control terminal of the control logic circuit is connected to the control terminal of the level detector; and upon the off-chip device is powered on, the control logic circuit is configured to control, based on the control signal, a switch transistor connected to the maximum input voltage to be turned on and other switch transistors to be turned off; in a case that the off-chip device is in an operating state after being powered on, the control signal includes the operating voltage value of the off-chip device, and the control logic circuit is configured to control, based on the control signal, a corresponding switch transistor to be turned on and other switch transistors to be turned off, wherein the input voltage value connected to the corresponding switch transistor is consistent with the operating voltage value.

14. The system according to claim 11, wherein the level selector comprises n PMOS transistors and a control logic circuit;

sources of the PMOS transistors are connected to different input voltages, drains of the PMOS transistors are connected together to form a common terminal, and the common terminal is used as the output terminal of the level selector to provide the chip IO interface with the interface level, a control terminal of the control logic circuit is connected to the control terminal of the level detector, and an output terminal of the control logic circuit is connected to gates of the PMOS transistors; and upon the off-chip device is powered on, the control logic circuit is configured to control, based on the control signal, a PMOS transistor connected to the maximum input voltage to be turned on and other PMOS transistors to be turned off; in a case that the off-chip device is in an operating state after being powered on, the control signal includes the operating voltage value of the off-chip device, and the control logic circuit is configured to control, based on the control signal, a corresponding PMOS transistor to be turned on and other PMOS transistors to be turned off, wherein the input voltage value connected to the corresponding PMOS transistor is consistent with the operating voltage value.

15. The system according to claim 11, wherein the level detector includes a level detecting circuit and a register, and the register is configured to store a correspondence relationship between voltages of the chip IO interface and operating voltage values of the off-chip device; wherein, a detection terminal of the level detecting circuit is connected to the chip IO interface, an output terminal of the level detecting circuit is connected to an input terminal of the register, and a control terminal of the register is connected to the control terminal of the level selector; and the level detecting circuit is configured to detect the voltage at the chip IO interface, the register is configured to obtain the operating voltage value of the off-chip device according to the voltage and the correspondence relationship, and generate the control signal based on the operating voltage value.

* * * * *